(12) United States Patent
Regis et al.

(10) Patent No.: US 9,470,734 B2
(45) Date of Patent: Oct. 18, 2016

(54) METHOD FOR PREDICTIVELY CONTROLLING THE OPERATION OF AN ELECTRONIC COMPONENT, ELECTRONIC EQUIPMENT AND CONTROL DEVICE

(75) Inventors: Didier Regis, Meudon la Foret Cedex (FR); Marc Gatti, Meudon la Foret Cedex (FR); Damien Jugie, Meudon la Foret Cedex (FR); Sebastien Thomas, Meudon la Foret Cedex (FR)

(73) Assignee: THALES, Neuilly sur Seine (FR)

( * ) Notice: Subject to any disclaimer, the term of this patent is extended or adjusted under 35 U.S.C. 154(b) by 699 days.

(21) Appl. No.: 13/358,138

(22) Filed: Jan. 25, 2012

(65) Prior Publication Data

US 2012/0215473 A1 Aug. 23, 2012

(30) Foreign Application Priority Data

Jan. 26, 2011 (FR) ...................................... 11 00233

(51) Int. Cl.
*G01R 31/00* (2006.01)
*G01R 31/28* (2006.01)
*G01R 29/08* (2006.01)

(52) U.S. Cl.
CPC ......... *G01R 31/002* (2013.01); *G01R 31/2817* (2013.01); *G01R 29/0814* (2013.01); *G01R 29/0892* (2013.01)

(58) Field of Classification Search
CPC .......................... G01R 29/0814; G01R 31/26
USPC ........................................................ 702/66
See application file for complete search history.

(56) References Cited

U.S. PATENT DOCUMENTS

| 4,815,077 A * | 3/1989 | Boenning ...................... 714/736 |
| 5,684,523 A * | 11/1997 | Satoh et al. .................. 347/247 |
| 6,160,517 A * | 12/2000 | Bell et al. ...................... 343/703 |
| 2006/0227085 A1* | 10/2006 | Boldt et al. ...................... 345/83 |
| 2009/0072248 A1* | 3/2009 | Im et al. .......................... 257/80 |
| 2010/0237854 A1 | 9/2010 | Kumhyr et al. |
| 2011/0084701 A1* | 4/2011 | Bancken et al. .............. 324/414 |

FOREIGN PATENT DOCUMENTS

WO    WO 02/012907    2/2002

OTHER PUBLICATIONS

Cicchiani et al., "Analysis of Electromagnetic Emissions to Determine UUT Health", 2008, IEEE Autotestcon.*
Ding, "Testing system design components for electromagnetic interference problems", 2007, Rohde-Schwarz; http://www.embedded.com/design/system-integ ration/4006815/Testing-system-design-components-for-electromagnetic-interference-problems.*
Vives-Gilabert et al., "Modeling Magnetic Radiations of Electronic Circuits Using Near-Field Scanning Method", 2007, IEEE Transactions on Electromagnetic Compatibility, pp. 391-400.*

(Continued)

*Primary Examiner* — Regis Betsch
(74) *Attorney, Agent, or Firm* — Knobbe, Martens, Olson & Bear, LLP (57) ABSTRACT

According to this method, an electromagnetic spectrum emitted by the electronic component during operation is measured and the measured electromagnetic spectrum is compared with a predetermined template defining at least one safe operating range in order to detect possible malfunction or risk of malfunction of the electronic component.

17 Claims, 5 Drawing Sheets

(56) References Cited

OTHER PUBLICATIONS

Boyer et al. "Characterization of the Evolution of IC Emissions After Accelerated Aging", 2009, IEEE Transactions on Electromagnetic Compatibility, vol. 51, No. 4, pp. 892-900.*

Poncelas et al., "Motor Fault Detection Using a Rogowski Sensor Without an Integrator", Oct. 2009, IEE Transactions on Industrial Electronics, vol. 56, No. 10, pp. 4062-4070.*
Brill, "Mobile screens: LED screens on the move" 2004 Screens Magazine, http://www.screens.ru/en/2004/9.html.*
Search Report issued in French App. No. 1100233 (2011).

* cited by examiner

METHOD FOR PREDICTIVELY CONTROLLING THE OPERATION OF AN ELECTRONIC COMPONENT, ELECTRONIC EQUIPMENT AND CONTROL DEVICE

BACKGROUND

The present invention relates to the field of controlling the reliability of electronic equipment.

Increasing miniaturization causes a drop in the reliability of electronic equipment and of their lifetime. For example, recent etching technologies used in the manufacturing of semiconductors give the possibility of attaining submicron etching finenesses (notably smaller than 180 nm) which cause a decrease in the lifetime of the semi-conductors considering the intrinsic degradation mechanisms of semiconductors such as hot injection of carriers (Hot Carrier Injection) or negative or positive bias temperature instability.

It is possible to control the logical operation of an electronic card. Controlling the logical operation consists of making sure that the electronic card or at least electronic components of the electronic card provide an expected response (output signals) to a determined input load (input signals). Such a control is generally carried out upon production completion.

Nevertheless, such a control of the logical operation only allows detection of malfunctions but does not allow anticipation of malfunction risks which may occur during the ageing of the electronic card because of electrical faults in its electronic components, initially present or occurring during the life of this so-called card.

One of the objects of the invention is to propose a method for controlling the operation of an electronic component which allows anticipation of the risks of malfunctions.

For this purpose, the invention proposes a method for predictively controlling the operation of an electronic component, wherein an electromagnetic spectrum emitted by the electronic component during operation is measured and the measured electromagnetic spectrum is compared with a predetermined template defining at least one secure operating range so as to detect a possible malfunction or risk of malfunction of the electronic component.

According to other embodiments, the method comprises one or more of the following features, taken individually or according to all technically possible combinations:
- the operation of the electronic component is controlled from the amplitude and/or the frequency of the electromagnetic spectrum of the electronic component;
- the operation of the electronic component is controlled upon manufacturing completion;
- the operation of the operating electronic component is controlled in a planned and/or sporadic way;
- a template associated with an electronic component is determined from measurements of the electromagnetic spectrum emitted by a set of electronic components of the same type during accelerated ageing tests.

The invention also relates to a method in which a template associated with an electronic component is determined from measurements of the electromagnetic spectrum emitted by a set of electronic components of the same type during accelerated ageing tests.

The invention further relates to a piece of electronic equipment comprising a support, at least one electronic component positioned on the support and a control device comprising at least one sensor positioned on the support so as to measure an electromagnetic spectrum emitted by the electronic component during operation of the piece of electronic equipment, and at least one processing unit able to compare the measured electromagnetic spectrum with a predetermined template defining at least one safe operating range in order to predict possible malfunction or risk of malfunction of the electronic component.

In an embodiment, each sensor is integrated into the thickness of the support.

In an embodiment, the processing unit is positioned on the support.

The invention further relates to a device for controlling the operation of a piece of electronic equipment, comprising at least one sensor able to measure the electromagnetic spectrum emitted by an electronic component during the operation of a piece of electronic equipment integrating the electronic component, and at least one processing unit able to compare the measured electromagnetic spectrum with a predetermined template defining at least one safe operating range in order to predict possible malfunction or risk of malfunction of the electronic component.

The invention further relates to a system for controlling the operation of a piece of electronic equipment, comprising means for controlling the logical operation of a piece of electronic equipment allowing measurement of the electric signals at the input and at the output of electronic components of the piece of electronic equipment, and a control device allowing measurement of the electromagnetic spectrum emitted by the electronic components.

BRIEF DESCRIPTION OF THE DRAWINGS

The invention and its advantages will be better understood upon reading the following description, only given as an example and made with reference to the appended drawings wherein.

Figure 1:
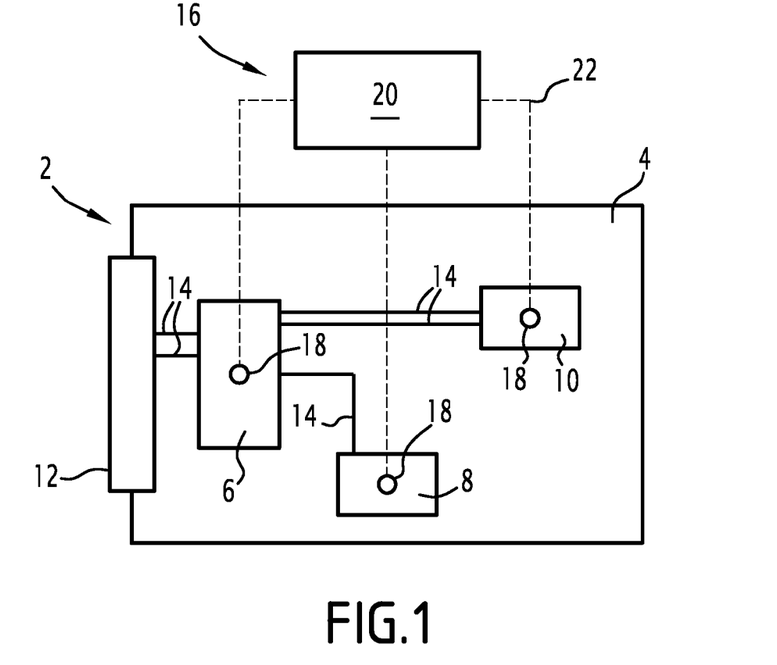
FIG. 1 is a schematic view of an electronic card and a device for controlling the electronic card.

The electronic card 2 illustrated in FIG. 1 comprises a supporting board 4, and electronic components 6, 8, 10 and at least one connector 12 attached on the board 4. The electronic components 6, 8, 10 are connected together and to the connector 12 via connection lines 14 according to a predetermined diagram.

The electronic card 2 forms a piece of electronic equipment per se or is part of a piece of electronic equipment comprising several electronic daughter cards connected on an electronic mother card.

The electronic components 6, 8, 10 are integrated circuits. The integrated circuits are for example specialized integrated circuits, generally called ASICs (Application-Specific Integrated Circuits) and/or programmable logic circuits, for example called FPGAs (Field Programmable Gate Arrays).

Each electronic component 6, 8, 10 for example defines a microprocessor, a volatile memory (RAM memory) or a read-only memory (ROM memory).

The control device 16 illustrated in FIG. 1 comprises sensors 18 able to measure an electromagnetic spectrum and to provide a corresponding signal and a processing unit 20 able to process the measurement signals transmitted by the sensors 18. The sensors 18 are connected to the processing unit through measurement signal lines 22.

Each sensor 18 is positioned in proximity to and preferably in register to an associated electronic component 6, 8, 10 so as to be able to measure an electromagnetic spectrum emitted by the electronic component or an element or an electronic component region during the operation of the latter.

Figure 2:
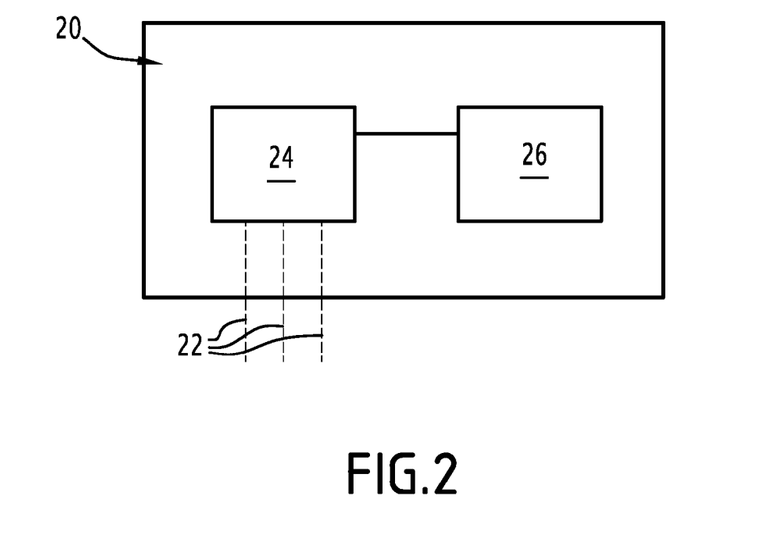
FIG. 2 is a schematic view of a control unit of the control device of FIG. 1.
Figure 3:
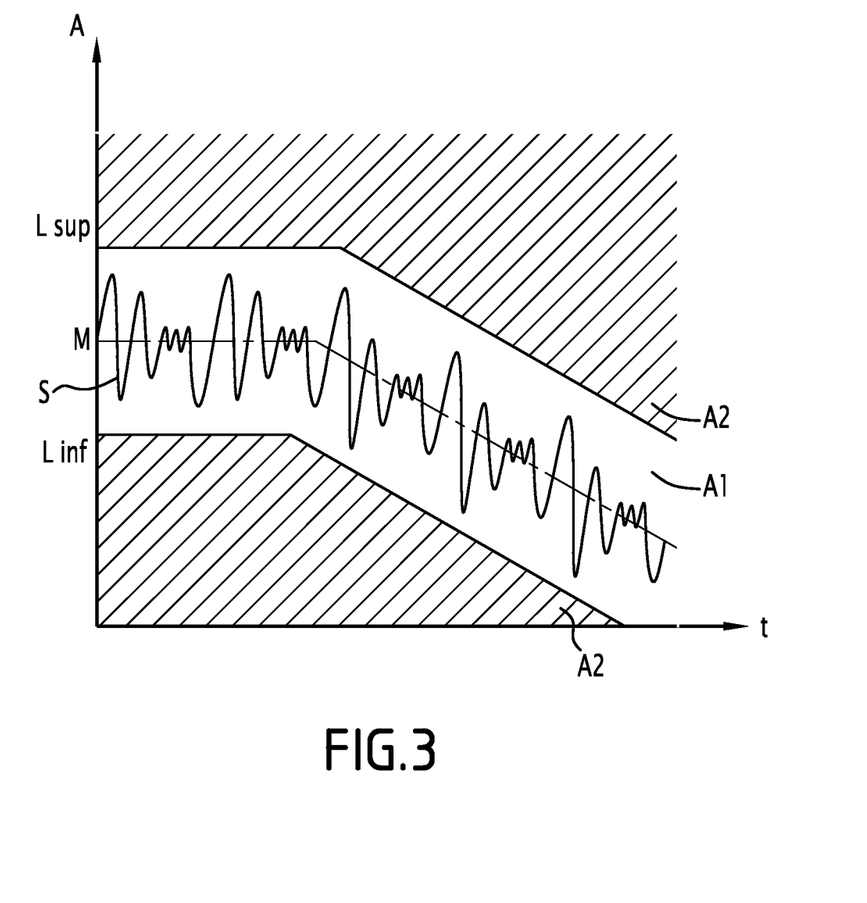
FIG. 3 is a graph illustrating a template of the electromagnetic spectrum of an electronic component over time.

As illustrated in FIG. 2, the processing unit 20 comprises a processing module 24 connected to the sensors 18 through the lines 22 and a storage module 26 in which electromagnetic spectrum templates associated with the electronic components 6, 8, 10 are prerecorded.

The processing module 24 is able to compare the measurement signal transmitted by a sensor 18 associated with an electronic component 6, 8, 10, with the template associated with this electronic component 6, 8, 10 in order to determine whether the electronic component 6, 8, 10 is operating satisfactorily.

During operation, each electronic component emits an electromagnetic spectrum. This electromagnetic spectrum in practice depends on the actual electronic component, on the operations carried out by this electronic component and on the ageing of the electronic component. An abnormal electromagnetic spectrum may be the sign of malfunction or premature ageing of the electronic component.

Figure 4:
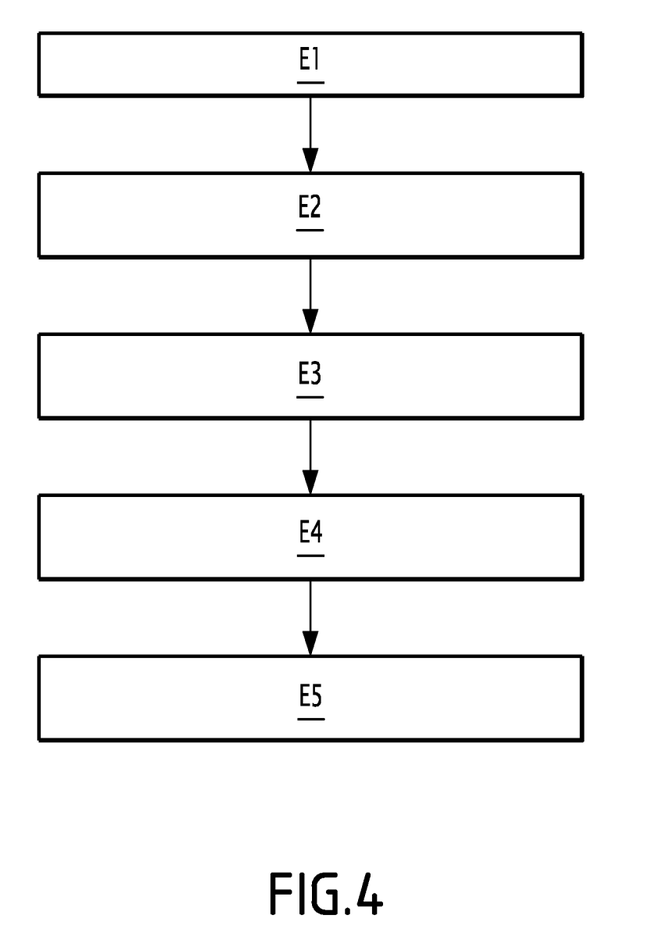
FIG. 4 is a block diagram illustrating steps of a method for controlling the operation of an electronic card according to the invention.

FIG. 4 is a graph illustrating in abscissae the time t and in ordinates the amplitude A of the electromagnetic spectrum and on which appears a measurement signal S representative of the electromagnetic spectrum emitted by an electronic component during operation, over time and an electromagnetic spectrum template associated with the electromagnetic component, defining a safe operating range A1 and an alert range A2.

The safe operating range A1 is defined between an upper limit Lsup and a lower limit Linf on either side of a line of average value M. The alert range A2 is defined above the upper limit and below the lower limit.

The template is obtained by carrying out measurements on similar electronic components during accelerated ageing tests and then by determining a safe operating range considered as being an range in which is located the electromagnetic spectrum of the electronic components which are operating satisfactorily. The safe operating range is determined for example according to a percentage of tested electronic components observing this safe operating range.

As illustrated in FIG. 4, the average value of the safe operating range A1 has an initial plateau and then decreases linearly over time. Indeed, the electromagnetic spectrum of the electronic components generally exhibits a drift over time which results from normal ageing of the electronic components, without it being the sign of a particular risk of malfunction.

The illustrated template only forms a possible example. Other template forms may be determined. For example, the difference between the upper limit and the lower limit may vary over time and notably decrease.

Moreover, the template may take into account the amplitude of the electromagnetic signal and/or other characteristics of the electromagnetic spectrum, such as the frequency analys of the electromagnetic spectrum, the main frequency and/or the harmonic frequencies.

The fact that an electromagnetic spectrum definitively or temporarily leaves the safe operating range A1 does not necessarily mean that the associated electronic component has a blocking operating fault. This may mean that the probability of a malfunction of the electronic component is high or is increasing and that it is preferable to schedule a replacement of this component or of the electronic card.

The measurement of the electromagnetic spectrum emitted during operation and its comparison with a predetermined template allows anticipation or prediction of malfunctions which will occur in the future, even when the electronic component exhibits apparently normal operation and notably a normal logical operation at the instant when the control is carried out.

During operation, the processing unit 20 records the electromagnetic spectrum emitted by each monitored electronic component.

The processing unit 20 may transmit reports on the operation of the electronic components in a planned way, upon demand from an operator and/or in the case of a serious malfunction. The reports are transmitted for example in the form of report files which may be edited in a form legible by an operator, for example as a graph, or as an alert signal perceivable by an operator.

The planned reports may be carried out at determined, regular and/or irregular time intervals and/or during particular events related to the stopping and to the restarting of a global system incorporating the electronic card 2.

FIG. 4 illustrates steps for elaborating and applying the control method according to the invention.

During a first characterization step E1, measurements of the electromagnetic spectrum emitted by a set of electronic components of the same type are carried out during accelerated ageing tests.

During a second modeling step E2, a model of the time-dependent change in the electromagnetic spectrum emitted by this type of electromagnetic component is defined.

During a third step E3 for forming a template, a safe operating range corresponding to satisfactory operation of the set of electronic components is determined from the model defined in the second step E2. The safe operating range is for example selected according to a percentage of electronic components exhibiting satisfactory logical operation and for which the electromagnetic spectrum is located in this range.

During a fourth control step E4, the electromagnetic spectrum emitted by a given electronic component is measured during operation.

During a fifth reporting step E5, a report on the electromagnetic spectrum emitted by the electronic component during operation is transmitted. If necessary, the report indicates whether the emitted electromagnetic spectrum has left the safe operating range of the electronic component.

The control device 16 may be separate or partly or completely integrated to the electronic device comprising the electronic components to be monitored.

As illustrated in FIG. 1, the control device 16 is separated from the electronic card 2.

Figure 5:
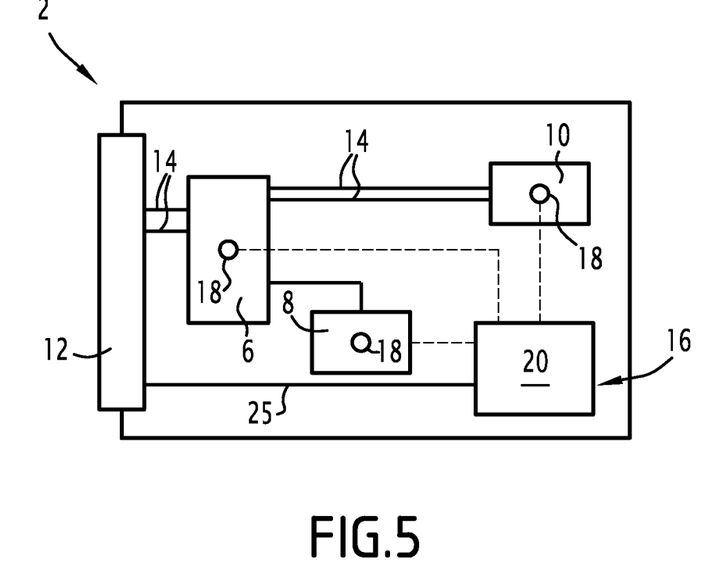
FIGS. 5-8 are schematic views of electronic cards and of devices for controlling these electronic cards.

As illustrated in FIG. 5, the control device 16 is completely integrated to the electronic card 2. More specifically, the sensors 18, the processing unit 20 and the measurement signal lines 22 are positioned on the board 4. The control device 16 further comprises an output line 25 connecting the processing unit 20 to the connector 12 so that the signals may be sent towards the outside of the electronic card 2.

Figure 6:
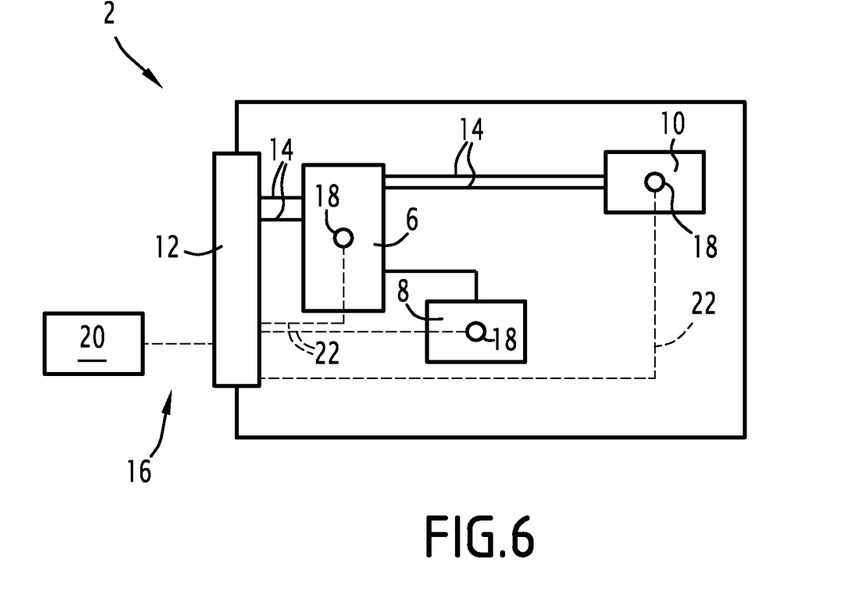

As illustrated in FIG. 6, the control device 16 is partly integrated to the electronic card 2. More specifically, the sensors 18 are positioned on the board 4 and connected to the board 12 through measurement signal lines 22. The processing unit 20 is separate from the electronic card 2 and laid out so as to be able to receive the measurement signals. The processing unit 20 is for example positioned on a mother card to which the electronic card 2 is connected. With such an embodiment, it is possible to mutualize a processing unit for several electronic mother or daughter cards connected together.

The sensors 18 of the control device 16 may be positioned on the support of the electronic device comprising the electronic components to be monitored. Each sensor 18 may in particular be positioned at right angles to the associated electronic component.

Figure 7:
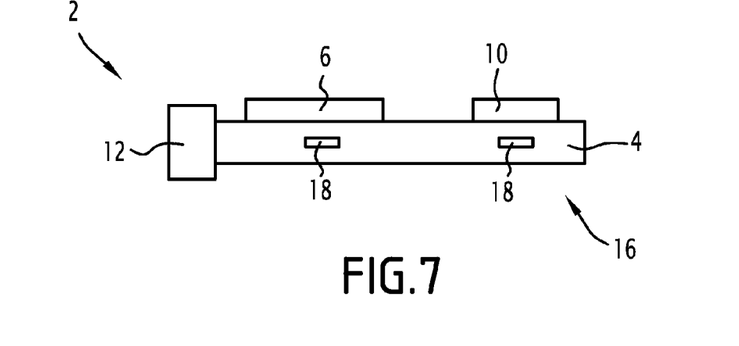

As illustrated in FIG. 7, each sensor 18 is positioned in the thickness of the board 4 of an electronic card 2, at right angles to the associated electronic components 6, 10 so as to measure the electromagnetic spectrum emitted by this electronic component. To do this, the board 4 is for example a multilayer board and each sensor 18 is positioned between two layers of the multilayer board 4.

In one alternative, each sensor 18 is positioned on one face of the board 4 opposite the face of the board on which is positioned the associated electronic component.

The control device may be separate from the piece of electronic equipment comprising the electronic components to be monitored.

Figure 8:
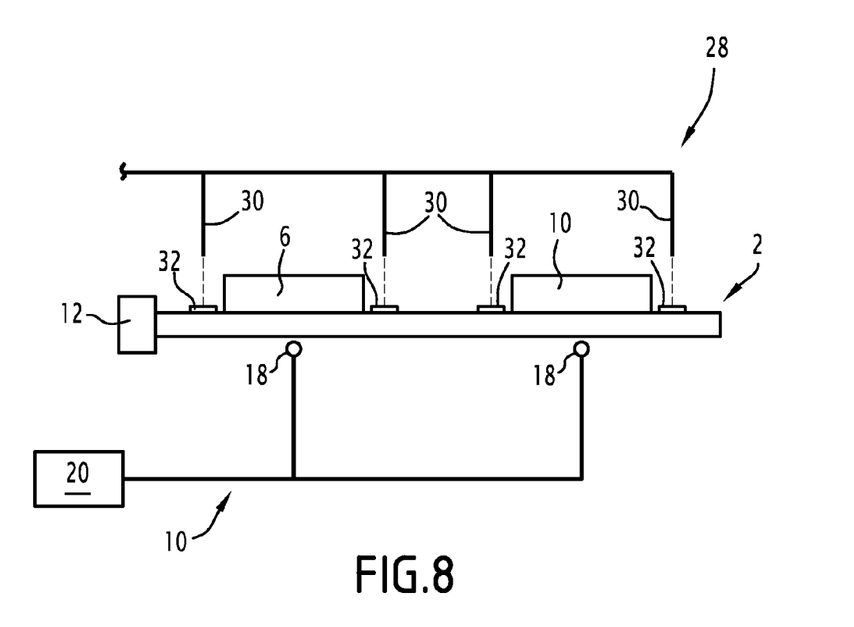

As illustrated in FIG. 8, a control system 28 comprises means for controlling the logical operation of an electronic card able to utilize the electric signals transmitted by the electronic components actuated by an excitation signal, and a control device 16 able to detect the electromagnetic spectrum of the electronic components.

The means for controlling the logical operation comprise a set of pins 30 able to be connected to control pads 32 provided on the electronic card 2 for measuring the electric signals at the input and/or at the output of the electronic components 6, 8, 10.

The control device 16 comprises the sensors 18 which may be moved so as to be placed at right angles to the electronic components 6, 8, 10 for measuring the electromagnetic spectrum emitted by each electronic component 6, 8, 10.

During operation, the electronic card 2 is picked up upon manufacturing completion, the pins 30 are connected onto the pads 32, the sensors 18 are positioned at right angles to the electronic components 6, 8, 10. Next, the electronic card 2 is actuated by means of an excitation signal, sent for example via the connector 12, and the electric signals measured by the pins 30 on the one hand and the electromagnetic signals measured by the sensors 18 on the other hand are recorded.

The electric signals recovered at the pins 30 allow control of the logical operation of the electronic components. This control is carried out in a conventional way.

In parallel, the electromagnetic signals recovered with the sensors 18 allow detection of the electronic faults in the electronic components 6, 8, 10. These faults may not have any immediate influence on the logical operation of the electronic components, but may be the sign of very limited lifetime.

The sensors 18 of the control device 16 are sensors sensitive to electromagnetic emissions. A sensor which is sensitive to electromagnetic emissions is for example an antenna or a coil. Such sensors may easily be integrated to the electronic card board.

Each sensor 18 is able to measure the electromagnetic spectrum emitted by an electronic component in its entirety, during operation, or to measure the electromagnetic spectrum emitted by an element or a particular region of the electronic component. Indeed it is possible to exclusively monitor proper operation of a sensitive region of an electronic component, for which the malfunction may the sign of a more global malfunction or cause a more global malfunction of the electronic component.

By means of the invention, it is possible to control upon manufacturing completion and/or during operation, a piece of electronic equipment so as to control the reliability thereof, i.e. anticipate or predict malfunctions. In particular, it is possible by measuring the electromagnetic spectrum, to detect electromagnetic spectra giving an alert on premature ageing of the electronic component. With the invention it is possible to anticipate malfunctions or to identify electronic components having high risks of malfunction or of fast ageing, even when the electronic components exhibit normal logical operation when the predictive control based on the measurement of the emitted electromagnetic spectrum is carried out.

The invention is applied to continuous or sporadic control upon manufacturing completion and/or upon operation, of on-board (car, airplanes, boats . . . ) and/or sensitive (nuclear . . . ) electronic equipment requiring reliability and monitoring of the reliability for reasons of safe operation.

The invention claimed is:

1. A method for predictively controlling the operation of an electronic circuit, the method comprising:
   repeatedly measuring, by at least one antenna, an electromagnetic spectrum emitted by each of a plurality of electronic components of the electronic circuit during operation of the electronic circuit; and
   comparing, by at least one processing unit, the measured electromagnetic spectra with at least one predetermined template defining at least one safe operating range in order to predict possible malfunction or risk of malfunction of the electronic components or fast aging of the electronic components,
   wherein at least one of the electronic components is configured to perform logical operations,
   wherein the electronic components are positioned on a support of the electronic circuit, and
   wherein the at least one antenna is integrated into the support.

2. The method according to claim 1, wherein the operation of the electronic components is controlled from the amplitude and/or from the frequency of the electromagnetic spectra of the electronic components.

3. The method according to claim 1, wherein the operation of the electronic components is controlled upon manufacturing completion.

4. The method according to claim 1, wherein the operation of the electronic components is controlled during operation, in a planned and/or sporadic way.

5. The method according to claim 1, wherein the predetermined template associated with at least one of the electronic components is determined from measurements of the electromagnetic spectra emitted by a set of electronic components of the same type during accelerated ageing tests.

6. The method of claim 1, wherein the predetermined template varies as a function of the age of the electronic circuit.

7. The method of claim 1, wherein the predetermined template comprises at least one limit defining the safe operating range and wherein the limit varies as a function of the age of the electronic circuit.

8. The method of claim 1, wherein the electronic component is an on-board electrical component of a vehicle.

9. The method according to claim 1, wherein the electronic components comprise at least one of: an Application-Specific Integrated Circuit (ASIC), a Field Programmable Gate Array (FPGA), a microprocessor, a volatile memory, and a read-only memory (ROM).

10. A piece of electronic equipment comprising:
a support;
a plurality of electronic components positioned on the support, each of the electronic components is configured to emit an electromagnetic spectrum during operation of the piece of electronic equipment;
a control device comprising at least one antenna positioned on the support so as to repeatedly measure the electromagnetic spectra emitted by the electronic components during the operation of the piece of electronic equipment; and
at least one processing unit configured to compare the measured electromagnetic spectra with at least one predetermined template defining at least one safe operating range in order to predict possible malfunction or risk of malfunction of the electronic components,
wherein at least one of the electronic components is configured to perform logical operations, and
wherein the at least one antenna is integrated into the support.

11. The piece of electronic equipment according to claim 10, wherein each antenna is integrated into the thickness of the support.

12. The piece of electronic equipment according to claim 11, wherein the processing unit is positioned on the support.

13. The piece of electronic equipment according to claim 10, wherein the processing unit is positioned on the support.

14. The piece of electronic equipment of claim 10, further comprising an electronic card including the support, wherein the support comprises a supporting board, and wherein the at least one sensor is mounted: i) on the support board, or ii) within the thickness of the support board.

15. The piece of electronic equipment according to claim 10, wherein the electronic components comprise at least one of: an Application-Specific Integrated Circuit (ASIC), a Field Programmable Gate Array (FPGA), a microprocessor, a volatile memory, and a read-only memory (ROM).

16. A device for controlling the operation of a piece of electronic equipment, comprising:
at least one antenna configured to measure electromagnetic spectra emitted by a plurality of electronic components during the operation of the piece of electronic equipment integrating the electronic components; and
at least one processing unit configured to compare the measured electromagnetic spectra with a predetermined template defining at least one safe operating range according to the method of claim 1 in order to predict possible malfunction or risk of malfunction of the electronic component.

17. A system for controlling the operation of a piece of electronic equipment, comprising:
means for controlling the logical operation of the piece of electronic equipment allowing measurement of the electric signals at the input and/or at the output of electronic components of the piece of electronic equipment; and
a control device according to claim 16 allowing measurement of the electromagnetic spectrum emitted by the electronic components.

* * * * *